United States Patent
Park

(10) Patent No.: US 12,007,447 B2
(45) Date of Patent: Jun. 11, 2024

(54) EVALUATION METHOD AND DEVICE ACCORDING TO PURPOSES OF REUSABLE BATTERY

(71) Applicant: PMGROW CORPORATION, Uiwang-si (KR)

(72) Inventor: Jae Hong Park, Seoul (KR)

(73) Assignee: PMGROW CORPORATION, Uiwang-si (KR)

(*) Notice: Subject to any disclaimer, the term of this patent is extended or adjusted under 35 U.S.C. 154(b) by 0 days.

(21) Appl. No.: 18/454,830

(22) Filed: Aug. 24, 2023

(65) Prior Publication Data
US 2023/0393206 A1    Dec. 7, 2023

Related U.S. Application Data

(63) Continuation of application No. PCT/KR2021/002546, filed on Mar. 2, 2021.

(30) Foreign Application Priority Data

Feb. 24, 2021    (KR) .................. 10-2021-0024595

(51) Int. Cl.
*G01R 31/367* (2019.01)
*G01R 31/374* (2019.01)
(Continued)

(52) U.S. Cl.
CPC ......... *G01R 31/367* (2019.01); *G01R 31/374* (2019.01); *G01R 31/387* (2019.01); *G01R 31/392* (2019.01)

(58) Field of Classification Search
CPC .. G01R 31/367; G01R 31/374; G01R 31/387; G01R 31/392
See application file for complete search history.

(56) References Cited

U.S. PATENT DOCUMENTS

2012/0203511 A1*   8/2012   DeVaul ............... A61B 5/0024
                                                         702/190
2013/0090872 A1    4/2013   Kurimoto
(Continued)

FOREIGN PATENT DOCUMENTS

AU    2021100545 A4 *  4/2021
CN    106855610 A  *  6/2017  ........... G01R 31/367
(Continued)

*Primary Examiner* — Tung S Lau
(74) *Attorney, Agent, or Firm* — NKL Law; Byungwoong Park

(57) ABSTRACT

An evaluation method and device according to the purposes of a reusable battery are disclosed. The disclosed method comprises the steps of: obtaining state of health (SOH) information, state of balance (SOB) information, and state of power (SOP) information of a reusable battery; extracting evaluation parameters from the SOH information, the SOB information, and the SOP information; substituting the evaluation parameters into each of a plurality of evaluation models which are set differently according to use purposes of the reused battery; and calculating an evaluation result corresponding to the use purposes of the reused battery from the evaluation parameters by using the plurality of evaluation models, wherein the SOB information includes information on a correlation between the SOC and the SOB according to a change in a state of charge (SOC) of the reusable battery.

7 Claims, 8 Drawing Sheets

(51) Int. Cl.
    *G01R 31/387*     (2019.01)
    *G01R 31/392*     (2019.01)

(56) References Cited

U.S. PATENT DOCUMENTS

2019/0033377 A1     1/2019   Karner et al.
2020/0249280 A1*   8/2020   Myung ................ G01R 31/374

FOREIGN PATENT DOCUMENTS

| | | | | |
|---|---|---|---|---|
| CN | 106054080 B | * | 5/2019 | |
| CN | 107367698 B | * | 8/2019 | |
| CN | 110275119 A | * | 9/2019 | |
| CN | 111060834 A | * | 4/2020 | |
| CN | 111260185 A | * | 6/2020 | |
| CN | 111707956 A | * | 9/2020 | ........... G01R 31/392 |
| JP | 2019-046644 A | | 3/2019 | |
| JP | 6610558 B2 | | 11/2019 | |
| JP | 6634881 B2 | | 1/2020 | |
| JP | 6717244 B2 | | 7/2020 | |
| JP | 2020-169871 A | | 10/2020 | |
| KR | 1020190027110 A | | 3/2019 | |
| KR | 102029776 B1 | | 10/2019 | |
| TW | 201524077 A | * | 6/2015 | |

\* cited by examiner

| Usage | Evaluation item | Evaluation results |
|---|---|---|
| ESS | Evolution grade | A |
| | Tolerant SOC range | 20~80 |
| | Tolerant output current range | 0.5C~0.7C |
| UPS | Evolution grade | B+ |
| | Tolerant SOC range | 30~70 |
| | Tolerant output current range | 0.5C~0.7C |
| Solar power | Evolution grade | B |
| | Tolerant SOC range | 30~70 |
| | Tolerant output current range | 0.5C~0.8C |
| Electric forklift | Evolution grade | B |
| | Tolerant SOC range | 40~70 |
| | Tolerant output current range | 0.5C~0.6C |

FIG. 8

EVALUATION METHOD AND DEVICE ACCORDING TO PURPOSES OF REUSABLE BATTERY

TECHNICAL FIELD

The following description relates to a method and apparatus for evaluating a reusable battery according to a usage thereof.

BACKGROUND

As an environment and energy are becoming issues, the demand for ecofriendly energy is increasing and accordingly, a battery is being used in various fields, such as an electric vehicle, to use power.

While using a battery in an electric vehicle, the battery is repeatedly charged and discharged and as the number of charges and discharges is accumulated, energy storage capacity of the battery gradually decreases. When the battery of the electric vehicle loses its energy storage capacity below a predetermined standard, the battery of the electric vehicle is replaced. Here, the old battery with degraded performance may be collected and recycled in various application fields, such as an energy storage system (ESS), an uninterruptible power supply (UPS) device, a solar power generation device, and other small vehicles.

For utilization and transaction of recycled batteries, it is important to evaluate quality of the recycled battery. In the art, various attempts are made to evaluate the quality of recycled batteries and a state of health (SOH) concept may be used as an index that represents a remaining life of a corresponding battery.

As a recycled battery is applied in various fields, specifications required for the recycled battery is also changing for each application field. However, since a current evaluation method for the recycled battery is standardized without considering its usage, evaluation results may have low reliability.

SUMMARY

According to at least one example embodiment, disclosed is an evaluation method and apparatus that may output evaluation results of a recycled battery in consideration of a use environment and requirements according to a usage of the recycled battery. According to at least one example embodiment, disclosed is an evaluation method and apparatus that may recommend an optimal usage of a recycled battery according to a state of the recycled battery. According to an aspect, disclosed is an evaluation method according to a usage of a reusable battery. The disclosed method includes obtaining state of health (SOH) information, state of balance (SOB) information, and state of power (SOP) information of a reusable battery; extracting evaluation parameters from the SOH information, the SOB information, and the SOP information; substituting the evaluation parameters into each of a plurality of evaluation models differently set according to usages of the reusable battery; calculating evaluation results corresponding to the usages of the reusable battery from the evaluation parameters using the plurality of evaluation models, the SOB information includes information on correlation between a state of charge (SOC) and the SOB according to a change in the SOC of the reusable battery.

According to at least one example embodiment, since evaluation models differently set according to usages of a reusable battery are used, it is possible to provide optimal evaluation results according to a usage of the reusable battery. According to at least one example embodiment, since an evaluation apparatus constructs an evaluation parameter using a state of balance (SOB) according to a change in a state of charge (SOC) of a reusable battery, a SOB according to a change in a rate of discharge (ROD) and a state of power (SOP), it is possible to easily implement differentiated evaluation according to required specifications of the reusable battery. According to at least one example embodiment, since an evaluation apparatus provides an optimal usage and use condition in consideration of a state of a reusable battery, it is possible to improve use efficiency of the reusable battery.

BRIEF DESCRIPTION OF DRAWINGS

FIG. 8 is a conceptual diagram illustrating schema of evaluation result data output from an evaluation apparatus.

DETAILED DESCRIPTION OF EXEMPLARY EMBODIMENTS

Figure 1:
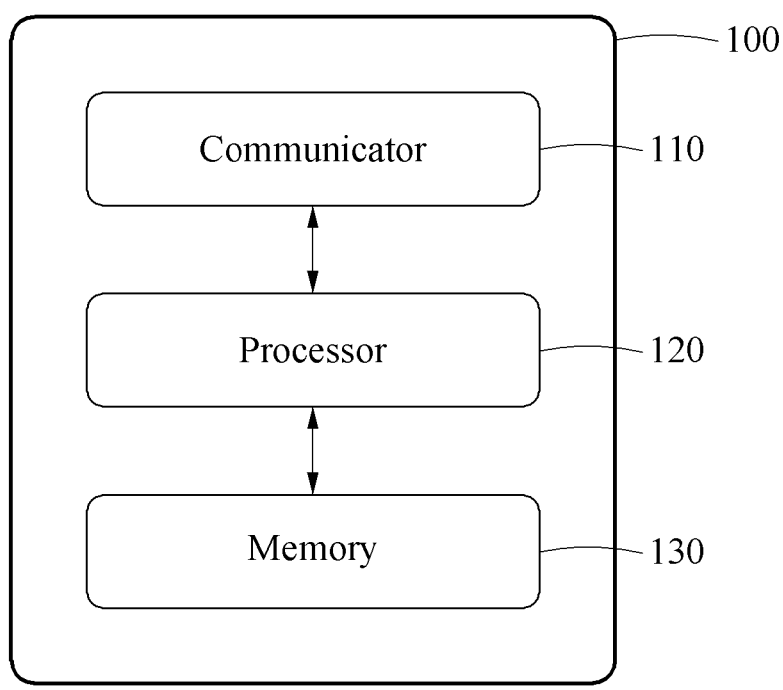
FIG. 1 is a diagram illustrating an evaluation apparatus according to a usage of a reusable battery according to an example embodiment.

According to an aspect, disclosed is an evaluation method according to a usage of a reusable battery. The disclosed method includes obtaining state of health (SOH) information, state of balance (SOB) information, and state of power (SOP) information of a reusable battery; extracting evaluation parameters from the SOH information, the SOB information, and the SOP information; substituting the evaluation parameters into each of a plurality of evaluation models differently set according to usages of the reusable battery; and calculating evaluation results corresponding to the usages of the reusable battery from the evaluation parameters using the plurality of evaluation models. The SOB information includes information on correlation between a state of charge (SOC) and the SOB according to a change in the SOC of the reusable battery.

The evaluation parameter may include information on SOC boundary values corresponding to boundary between a plurality of levels set for a SOB value of the reusable battery.

The evaluation parameter may include information on correlation between the SOB and a rate of discharge (ROD) according to a change in the ROD of the reusable battery.

The evaluation parameter may include information on an upper limit of tolerant output for each operating time of the reusable battery.

The plurality of evaluation models may be configured to set a weight for each of the evaluation parameters based on information on a SOB tolerance section corresponding to a usage of the reusable battery, a use temperature of the reusable battery, and required power of the reusable battery.

The evaluation results may include evaluation results for a SOC available section according to the usage of the reusable battery that is determined based on the SOB tolerance section corresponding to the usage of the reusable battery, the use temperature of the reusable battery, and the required power of the reusable battery, evaluation results for a use temperature tolerance section according to the usage of the reusable battery, and evaluation results for tolerant output according to the usage of the reusable battery.

The evaluation results may include recommendation information on a usage suitable for the reusable battery among a predetermined plurality of usages.

According to another aspect, disclosed is an evaluation apparatus according to a usage of a reusable battery. The evaluation apparatus includes a communicator; and a processor configured to connect to the communicator. The processor is configured to perform a process of obtaining SOH information, state of balance (SOB) information, and state of power (SOP) information of a reusable battery, a process of extracting evaluation parameters from the SOH information, the SOB information, and the SOP information, a process of substituting the evaluation parameters into each of a plurality of evaluation models differently set according to usages of the reusable battery, and a process of calculating evaluation results corresponding to the usages of the reusable battery from the evaluation parameters using the plurality of evaluation models, and the SOB information includes information on correlation between a state of charge (SOC) and the SOB according to a change in the SOC of the reusable battery.

MODE

Specific structural or functional description related to example embodiments are provided for examples only and various modifications and changes may be made to the example embodiments. Therefore, the example embodiments should not be construed as being limited to only the specific example embodiments. Rather, the scope of the present specification should be understood to include all of the modifications, equivalents, and substitutions included in the spirit and technical scope of the disclosure.

Although the terms "first," "second," etc., may be used herein to describe various components, the terms are only used to distinguish one component from another component. For example, a first component may also be termed a second component and, likewise, a second component may be termed a first component.

When a component is referred to as being "connected to" or "accessed to" another component, it should be understood that the component may be directly connected to or accessed to the other component, or one or more other intervening components may be present.

The singular forms "a," "an," and "the," are intended to include the plural forms as well, unless the context clearly indicates otherwise. It will be further understood that the terms "comprises/comprising (incudes/including)," and "has/having" when used in this specification, specify the presence of stated features, integers, steps, operations, elements, components, and/or combination thereof, but do not preclude the presence or addition of one or more other features, integers, steps, operations, elements, components, and/or combination thereof.

Unless otherwise defined, all terms including technical and scientific terms used herein have the same meaning as commonly understood by one of ordinary skill in the art to which the example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Hereinafter, example embodiments will be described in detail with reference to the accompanying drawings. Describing with reference to the accompanying drawings, like reference numerals refer to like elements throughout and repeated description related thereto is omitted.

FIG. 1 is a diagram illustrating an evaluation apparatus 100 according to a usage of a reusable battery according to an example embodiment.

Referring to FIG. 1, the evaluation apparatus 100 may achieve desired system performance using a combination of typical computer hardware (e.g., a device that may include a computer processor, a memory, a storage, an input device and an output device, and components of other existing computing devices; an electronic communication device, such as a router, a switch, etc.; and an electronic information storage system such as a network-attached storage (NAS) and a storage area network (SAN)) and computer software (i.e., instructions that allow a computing device to operate in a specific manner). The evaluation apparatus 100 may include a communicator 110, a processor 120, and a memory 130, and may directly or indirectly communicate with an external computing device (not shown) through the communicator 110.

The evaluation apparatus 100 may receive measurement parameters for a reusable battery through the communicator 110. For example, the evaluation apparatus 100 may receive state of health (SOH) information on a life of the reusable battery, state of power (SOP) information of a power life, and state of balance (SOB) information on balance of the battery.

The communicator 110 may transmit and receive a request and a response with interacting another computing device. For example, the request and the response may be performed through the same transmission control protocol (TCP) session, but without being limited thereto, may be transmitted and received as, for example, user datagram protocol (UDP) datagram. In addition, in a broad sense, the communicator 110 may include a keyboard, a pointing device such as a mouse, other external input devices, a printer, a display, and other external output devices, to receive a command or an instruction.

The processor 120 may include a hardware component, such as a micro processing unit (MPU), a central processing unit (CPU), a graphics processing unit (GPU) or a tensor processing unit (TPU), a cache memory, and a data bus, and also may further include a software component of an operating system (OS) and an application that performs a specific purpose.

Figure 2:
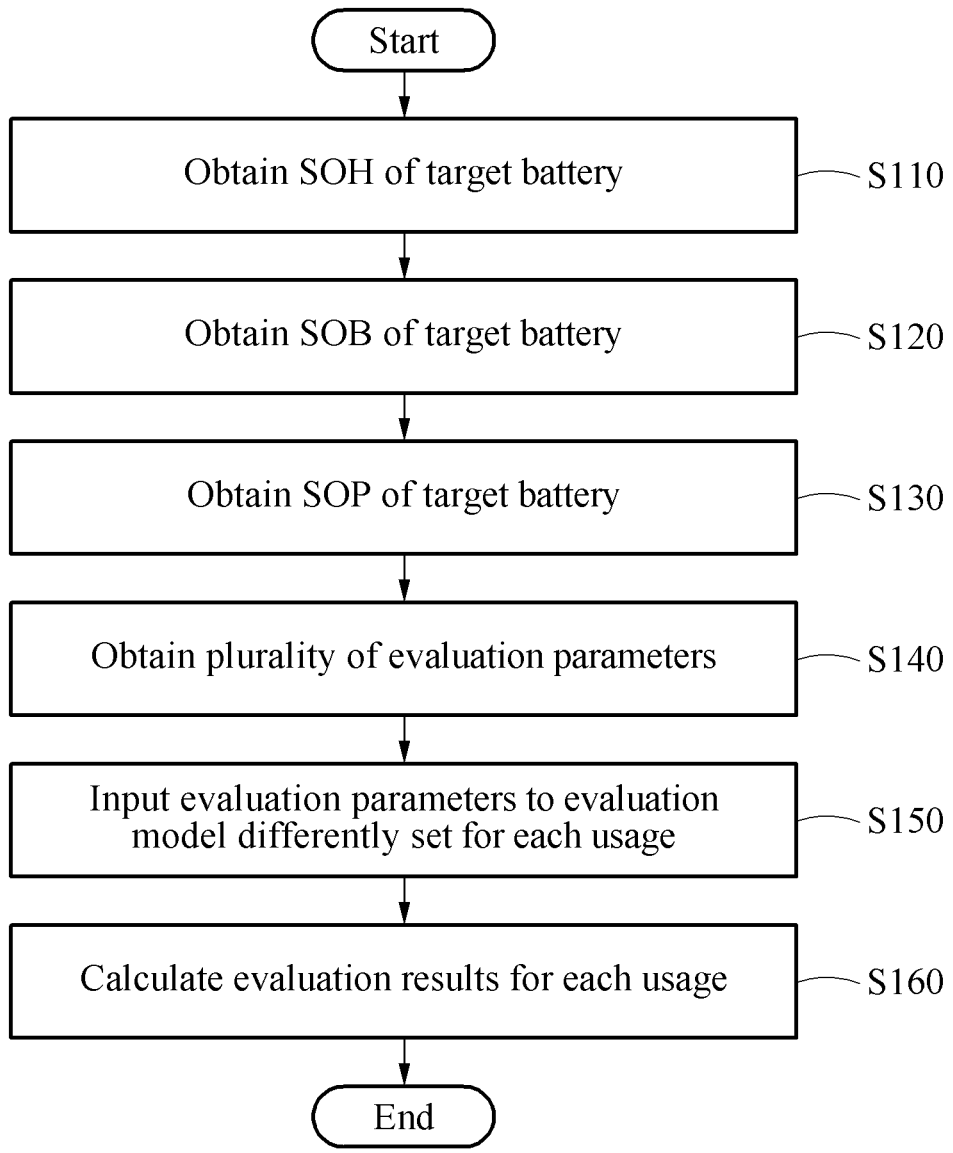
FIG. 2 is a flowchart illustrating an evaluation method according to a usage of a reusable battery performed by an evaluation apparatus according to an example embodiment.

FIG. 2 is a flowchart illustrating an evaluation method of a reusable battery performed by the evaluation apparatus 100 according to an example embodiment.

Referring to FIG. 2, in operation S110, the evaluation apparatus 100 may obtain state of health (SOH) information. The SOH information may be determined based on a ratio between available capacity of a reusable battery and available capacity of a new battery. The SOH information may be determined based on data obtained through a charge/discharge test on the reusable battery. As another example, the SOH information may be estimated from a change in a state of charge (SOC) according to a change in open circuit voltage (OCV). The SOH information may be expressed as a single value. As another example, the evaluation apparatus 100 may obtain the SOH information including a plurality of SOH values depending on temperature of the reusable battery.

In operation S120, the evaluation apparatus 100 may obtain state of balance (SOB) information that represents a state of balance of the reusable battery. The SOB may be an index that represents equality between cells that constitute the reusable battery. The SOB of the reusable battery may vary according to an index for remaining capacity of the reusable battery, that is, a SOC. For example, a value of the SOB may decrease as the SOC goes closer to both extreme values.

Figure 3:
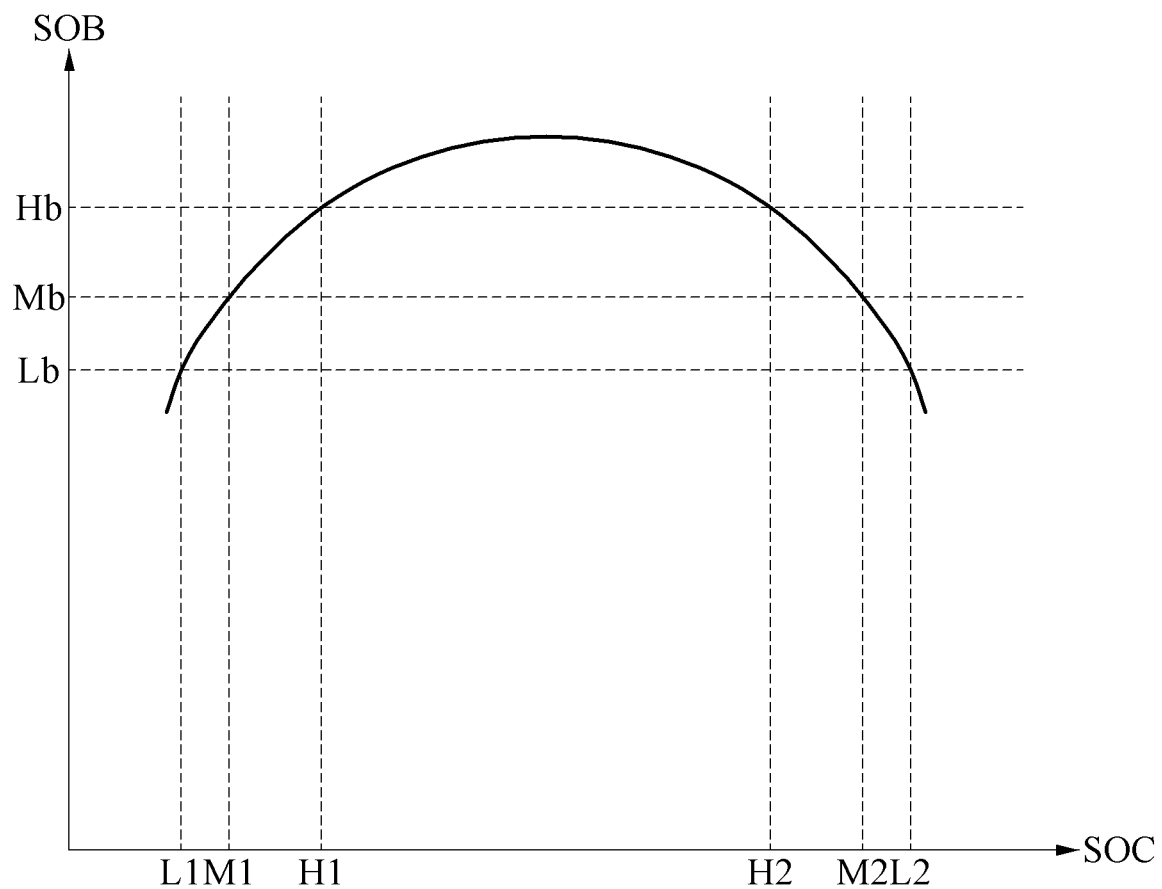
FIG. 3 is a graph showing an example of correlation between a state of balance (SOB) and a state of charge (SOC) of a reusable battery.

FIG. 3 is a graph showing an example of correlation between a SOB and a SOC of a reusable battery.

Referring to FIG. 3, the SOB of the reusable battery has a maximum value when the SOC has a specific value and a value of the SOB may decrease as a value of the SOC is farther away from the specific value.

The evaluation apparatus 100 may divide and set a change section of the SOB according to a change in the SOC into a plurality of sections. For example, a first SOB value (Hb) may be a boundary value between a first section having a largest SOB value and a second section having a second largest SOB value. A second SOB value (Mb) may be a boundary value between the second section having the second largest SOB value and a third section having a third largest SOB value. Also, a third SOB value (Lb) may be a boundary value between the third section having the third largest SOB value and a fourth section having a smallest SOB value. Although the value of the SOB is described through division into four sections in FIG. 3, it is provided as an example only. The section for SOB values my include the number of sections less than 4 or greater than 4.

The first SOB value (Hb) may correspond to a (1-1)-th SOC value (H1) and a (1-2)-th SOC value (H2). The second SOB value (Mb) may correspond to a (2-1)-th SOC value (M1) and a (2-2)-th SOC value (M2). The third SOB value (Lb) may correspond to a (3-1)-th SOC value (L1) and a (3-2)-th SOC value (L2). The evaluation apparatus 100 may obtain SOC values (H1, H2, M1, M2, L1, and L2) corresponding to boundaries of sections of SOB values as SOB information.

Figure 4:
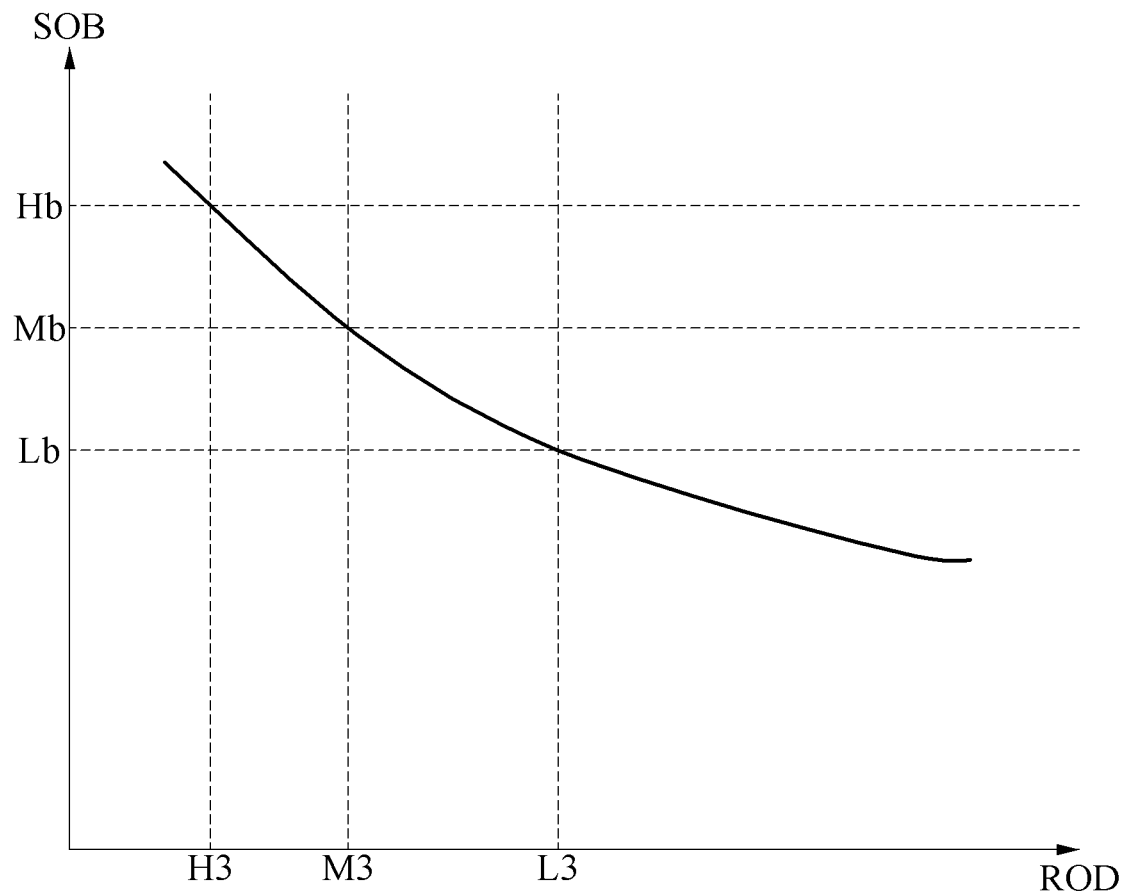
FIG. 4 is a graph showing an example of correlation between a SOB and a rate of discharge (ROD) of a reusable battery.

FIG. 4 is a graph showing an example of correlation between a SOB and a rate of discharge (ROD) of a reusable battery.

Referring to FIG. 4, as the ROD of the reusable battery increases, a SOB value may decrease. The evaluation apparatus 100 may divide and set a change section of the SOB according to a change in the ROD of the reusable battery. The first SOB value (Hb), the second SOB value (Mb), and the third SOB value (Lb) may be boundary values between the respective sections of SOB values. The evaluation apparatus 100 may obtain a first ROD value (H3) corresponding to the first SOB value (Hb), a second ROD value (M3) corresponding to the second SOB value (Mb), and a third ROD value (L3) corresponding to the third SOB value (Mb) as SOB information.

Referring again to FIG. 2, in operation S130, the evaluation apparatus 100 may obtain state of power (SOP) information of the reusable battery. The SOP information may be an index for a power life. For example, the SOP information may include information on a maximum amount of discharge per unit time of the reusable battery. The SOP information may include a plurality of parameters. For example, the SOP information may include information on a maximum amount of discharge per unit time that may be maintained during a smallest first period of time, a maximum amount of discharge per unit time that may be maintained during a second period of time greater than the first period of time, and a maximum amount of discharge per unit time that may be maintained during a third period of time greater than the second period of time. The aforementioned description is provided as an example only and the SOP information may be configured in a different manner.

In operation S140, the evaluation apparatus 100 may construct evaluation parameters based on the information obtained in operations S110 to S130. In operation S150, the evaluation apparatus 100 may calculate evaluation results corresponding to a usage of the reusable battery by substituting the evaluation parameters into an evaluation model. Weights of the evaluation parameters may vary in an evaluation process according to the usage of the reusable battery. For example, in the case of an energy storage system (ESS), since uniformity between cells of the reusable battery is prioritized rather than output performance, a weight of an evaluation parameter related to SOB information may be set to be high. As another example, in the case of a forklift and the like, since output of the reusable battery needs to be guaranteed, a weight of an evaluation parameter related to SOP information may be set to be high.

The evaluation apparatus 100 may use a plurality of evaluation models to calculate evaluation results of the reusable battery in consideration of the usage of the reusable battery. Each of the plurality of evaluation models may be differently set according to a corresponding usage of the reusable battery.

Figure 5:
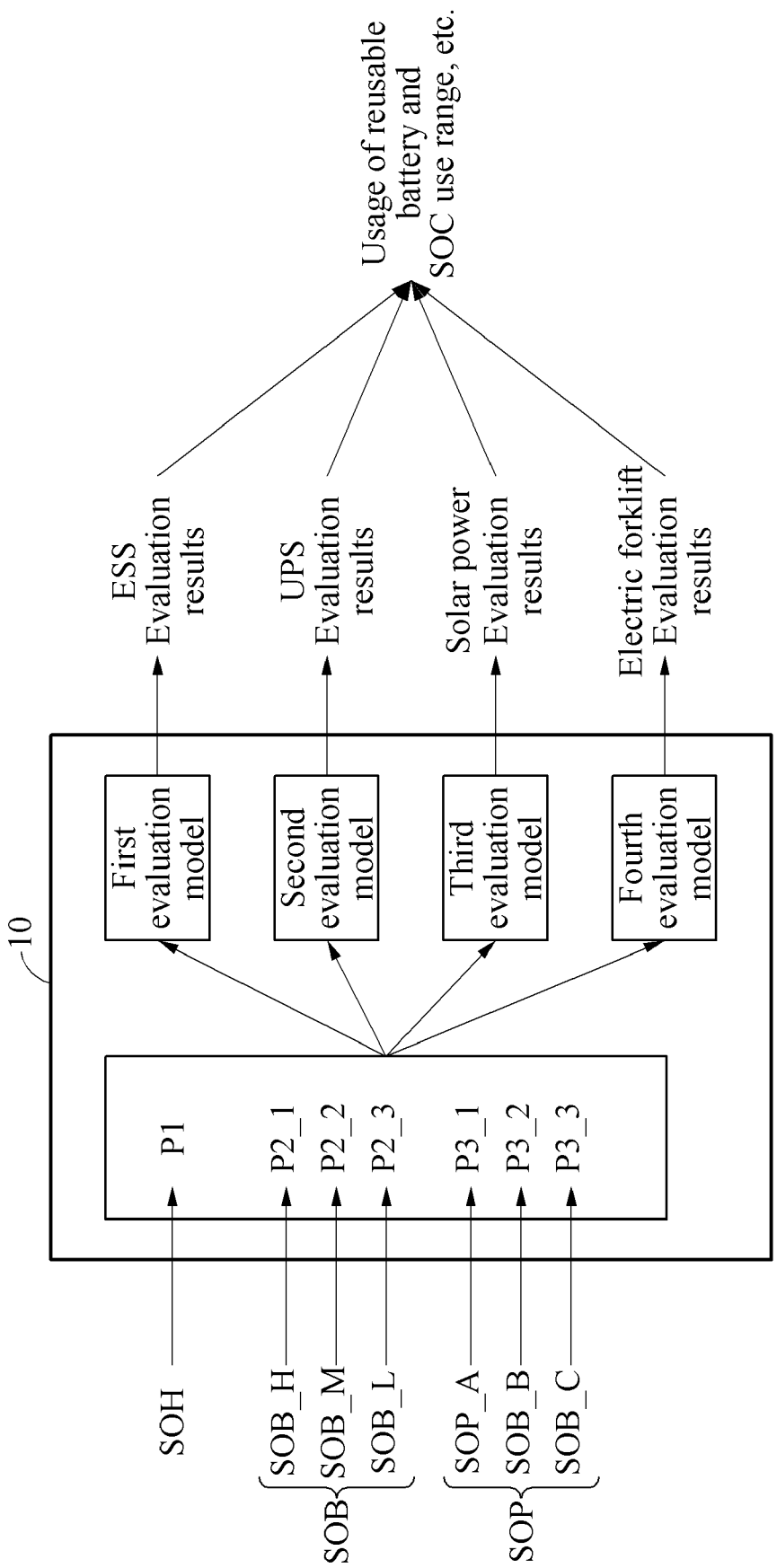
FIG. 5 is a conceptual diagram illustrating a process of calculating, by an evaluation apparatus, evaluation results according to a usage of a reusable battery.

FIG. 5 is a conceptual diagram illustrating a process of calculating, by the evaluation apparatus 100, evaluation results according to a usage of a reusable battery Referring to FIG. 5, the evaluation apparatus 100 may extract evaluation parameters P1, P2_1, P2_2, P2_3, P3_1, P3_2, and P3_3 from the SOH information, the SOB information, and the SOP information obtained from operations S110 to S130. Although FIG. 5 illustrates a case in which the evaluation apparatus 100 extracts a single parameter (P1) from the SOH information, an example embodiment is not limited thereto. For example, the evaluation apparatus 100 may extract a plurality of parameters in consideration of a change in SOH values according to a change in temperature.

The evaluation apparatus 100 may extract the evaluation parameters P2_1, P2_2, and P2_3 from the SOB information. For example, the parameter P2_1 may be determined based on the (1-1)-th SOC value (H1) and the (1-2)-th SOC value (H2) of FIG. 3. The evaluation parameter P2_2 may be determined based on the (2-1)-th SOC value (M1) and the (2-2)-th SOC value (M2) of FIG. 3. The evaluation parameter P2_3 may be determined based on the (3-1)-th SOC value (L1) and the (3-2)-th SOC value (L2) of FIG. 3.

As described above, since the evaluation apparatus 100 determines the evaluation parameters P2_1, P2_2, and P2_3 based on SOC values (L1, L2, M1, M2, H1, and H2) corresponding to boundaries of SOB sections, a SOC operation section of the reusable battery and SOC values corresponding thereto may be applied to the evaluation results. The evaluation apparatus 100 may apply SOB requirements according to a usage of the reusable battery and may output information on a SOC section capable of operating the reusable battery as evaluation results.

As another example, the parameter P2_1 may be determined based on the first ROD value (H3) of FIG. 4. The evaluation parameter P2_2 may be determined based on the second ROD value (M3) of FIG. 4. The evaluation parameter P2_3 may be determined based on the third ROD value (L3) of FIG. 4.

As described above, the evaluation apparatus 100 may determine the evaluation parameters P2_1, P2_2, and P2_3 based on ROD values (L3, M3, and H3) corresponding to boundaries of the SOB sections and accordingly may apply ROD values corresponding to a SOB operation section of the reusable battery to the evaluation results. The evaluation apparatus 100 may apply SOB requirements according to a usage of the reusable battery and may output information on the range of ROD allowed in a process of operating the reusable battery as evaluation results.

The evaluation apparatus 100 may extract the evaluation parameters P3_1, P3_2, and P3_3 from the SOP information. For example, the parameter P3_1 may be determined based on a maximum amount of discharge per unit time of the reusable battery that may be maintained during the first period of time. The parameter P3_2 may be determined based on a maximum amount of discharge per unit time of the reusable battery that may be maintained during the second period of time. The parameter P3_3 may be determined based on a maximum amount of discharge per unit time of the reusable battery that may be maintained during the third period of time.

As described above, the evaluation apparatus 100 may determine the maximum amounts of discharge (P3_1, P3_2, and P3_3) per unit time of the reusable battery and accordingly may apply available time values of the reusable battery corresponding to a SOP operation section of the reusable battery to evaluation results. The evaluation apparatus 100 may determine the evaluation parameters P2_1, P2_2, and P2_3 by applying SOP requirements according to a usage of the reusable battery and accordingly, may apply ROD values corresponding to the SOB operation section of the reusable battery to the evaluation results. The evaluation apparatus 100 may output a tolerant output current range of the reusable battery as the evaluation results in consideration of an operating time or output requirements according to the usage of the reusable battery.

The evaluation apparatus 100 may calculate the evaluation results according to the usage of the reusable battery by inputting the evaluation parameters P1, P2_1, P2_2, P2_3, P3_1, P3_2, and P3_3 to each of the plurality of evaluation models. For example, when the evaluation apparatus 100 is used in the field of an ESS using a first evaluation model, the evaluation apparatus 100 may calculate evaluation results of the reusable battery. Also, when the evaluation apparatus 100 is used in the field of uninterruptible power supply (UPS) using a second evaluation model, the evaluation apparatus 100 may calculate evaluation results of the reusable battery. The evaluation apparatus 100 may calculate optimal evaluation results in consideration of a use environment of the reusable battery by using the plurality of evaluation models differently set according to usages of the reusable battery.

Figure 6:
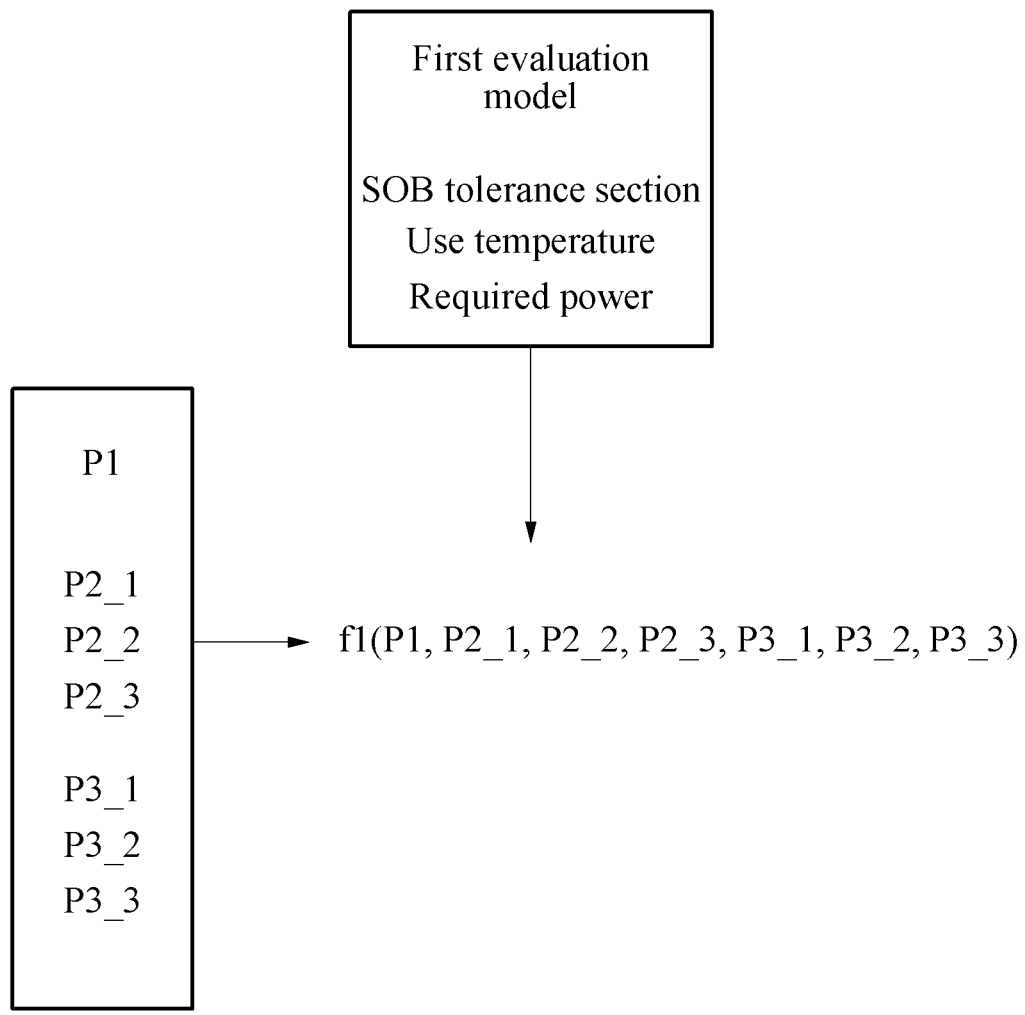
FIG. 6 is a conceptual diagram illustrating an operation process of an evaluation model of FIG. 5.

FIG. 6 is a conceptual diagram illustrating an operation process of an evaluation model of FIG. 5.

Referring to FIG. 6, the evaluation model may be defined as a function (f) that receives an input of evaluation parameters and calculates evaluation results. Here, parameters that determine the function (f) may be differently set according to a usage of a reusable battery corresponding to the evaluation model. For example, the parameters that determine the function (f) may be determined based on a SOB tolerance section, a use temperature, and required power according to the usage of the reusable battery.

Figure 7:
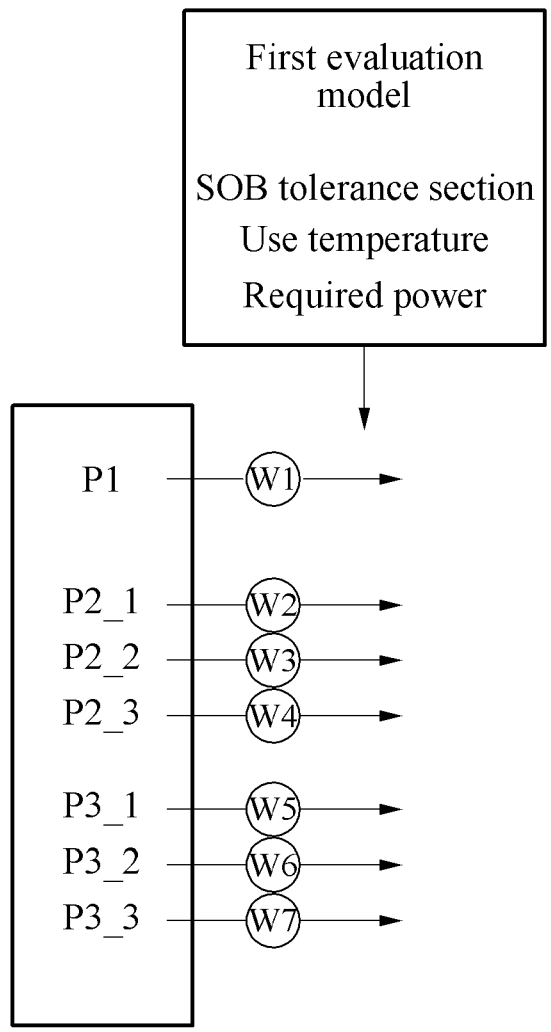
FIG. 7 is a conceptual diagram illustrating an operation process of the evaluation model of FIG. 5.

FIG. 7 is a conceptual diagram illustrating an operation process of the evaluation model of FIG. 5.

Referring to FIG. 7, each of evaluation models may differently set weights W1, W2, W3, W4, W5, W6, and W7 for evaluation parameters P1, P2_1, P2_2, P2_3, P3_1, P3_2, and P3_3. For example, a first evaluation model for an ESS may set absolute values of the weights W2, W3, and W4 of the evaluation parameters P2_1, P2_2, and P2_3 related to a SOB to be high. On the contrary, a fourth evaluation model for an electric forklift that requires high power may set absolute values of the weights W5, W6, and W7 of the evaluation parameters P3_1, P3_2, and P3_3 related to a SOP to be high. The weights W1, W2, W3, W4, W5, W6, and W7 to be assigned by evaluation model may be determined based on a usage of the reusable battery corresponding to the evaluation model. The evaluation apparatus 100 may output the weights W1, W2, W3, W4, W5, W6, and W7 by inputting a SOB tolerance section, use temperature, and required output of the reusable battery to a predetermined function. The evaluation apparatus 100 may apply the output weights W1, W2, W3, W4, W5, W6, and W7 to evaluation parameters in a process of applying a corresponding evaluation model.

FIG. 8 is a conceptual diagram illustrating schema of evaluation result data output from the evaluation apparatus 100.

Referring to FIG. 8, evaluation results may include evaluation results for each usage of a reusable battery. Evaluation results corresponding to each usage may include a plurality of fields. For example, the evaluation results may include a field for an overall evaluation grade of the reusable battery when applied to a corresponding usage, a field for a SOC range capable of operating the reusable battery in the corresponding usage, and a field for tolerant output current of the reusable battery in the corresponding usage.

An evaluation apparatus and method according to a usage of a reusable battery according to example embodiments are described above with reference to FIGS. 1 to 8. According to at least one example embodiment, since evaluation models differently set according to usages of a reusable battery are used, it is possible to provide optimal evaluation results according to a usage of the reusable battery. According to at least one example embodiment, since an evaluation apparatus constructs an evaluation parameter using a SOB according to a change in a SOC of a reusable battery, a SOB according to a change in a ROD and a SOP, it is possible to easily implement differentiated evaluation according to required specifications of the reusable battery. According to at least one example embodiment, since an evaluation apparatus provides an optimal usage and use condition in consideration of a state of a reusable battery, it is possible to improve use efficiency of the reusable battery.

The example embodiments may be implemented using hardware components, software components, and/or combination thereof. For example, the apparatuses, the methods, and the components described in the example embodiments may be implemented using one or more general-purpose or special purpose computers, such as, for example, a processor, a controller, an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The software may include a computer program, a piece of code, an instruction, or at least one combination thereof, for independently or collectively instructing or configuring the processing device to operate as desired. Software and/or data may be permanently or temporarily embodied in any type of machine, component, physical equipment, virtual equipment, a computer storage medium or device, or a transmitted signal wave to be interpreted by the processing device or to provide an instruction or data to the processing device. The software also may be distributed over network coupled computer systems so that the software is stored and executed in a distributed fashion. The software and data may be stored by one or more computer readable storage media.

The methods according to the above-described example embodiments may be configured in a form of program instructions performed through various computer devices and recorded in computer-readable media. The media may also include, alone or in combination with the program instructions, data files, data structures, and the like. The program instructions recorded in the media may be specially designed and configured for the example embodiments or may be known to those skilled in the computer software art and thereby available. Examples of the media include magnetic media such as hard disks, floppy disks, and magnetic tapes; optical media such as CD-ROM and DVD; magneto-optical media such as floptical disks; and hardware devices that are specially configured to store program instructions, such as read-only memory (ROM), random access memory (RAM), flash memory, and the like. Examples of program instructions include both machine code, such as produced by a compiler, and a higher language code that may be executed by the computer using an interpreter. The hardware device may be configured to operate as at least one software module to perform an operation of the example embodiments, or vice versa.

While the example embodiments are described with reference to specific example embodiments and drawings, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, or replaced or supplemented by other components or their equivalents.

What is claimed is:

1. A method for an evaluation of a reusable battery with an aid of a digital computer, the method comprising:
providing the computer with a data base including state of health (SOH) information, state of balance (SOB) information, and state of power (SOP) information of the reusable battery;
extracting, by the computer, evaluation parameters from the SOH information, the SOB information, and the SOP information;
inputting, by the computer, the evaluation parameters into each of a plurality of evaluation models that differently set a weight for each of the evaluation parameters according to usages of the reusable battery; and
calculating, by the computer, evaluation results corresponding to the usages of the reusable battery from the evaluation parameters using the plurality of evaluation models; and
automatically classifying at least one usage of the reusable battery based on the evaluation results,
wherein the SOB information includes information on correlation between the SOC and the SOB according to a change in the SOC of the reusable battery, and
wherein the evaluation parameter includes information on:
SOC boundary values corresponding to boundary between a plurality of levels set for a SOB value of the reusable battery;
correlation between the SOB and a rate of discharge (ROD) according to a change in the ROD of the reusable battery; and
an upper limit of tolerant output for each operating time of the reusable battery.

2. The method of claim 1, wherein the plurality of evaluation models set the weight for each of the evaluation parameters based on information on a SOB tolerance section corresponding to a usage of the reusable battery, a use temperature of the reusable battery, and required power of the reusable battery.

3. The method of claim 2, wherein the evaluation results include evaluation results for a SOC available section according to the usage of the reusable battery that is determined based on the SOB tolerance section corresponding to the usage of the reusable battery, the use temperature of the reusable battery and the required power of the reusable battery, evaluation results for a use temperature tolerance section according to the usage of the reusable battery, and evaluation results for tolerant output according to the usage of the reusable battery.

4. The method of claim 3, wherein the evaluation results further include recommendation information on a usage suitable for the reusable battery among a predetermined plurality of usages.

5. A apparatus for an evaluation of a reusable battery, the apparatus comprising:
a communicator; and
a processor configured to connect to the communicator, wherein the processor is configured to perform:
a process of obtaining state of health (SOH) information, state of balance (SOB) information, and state of power (SOP) information of the reusable battery;
a process of extracting evaluation parameters from the SOH information, the SOB information, and the SOP information;
a process of inputting the evaluation parameters into each of a plurality of evaluation models that differently set a weight for each of the evaluation parameters according to usages of the reusable battery;
a process of calculating evaluation results corresponding to the usages of the reusable battery from the evaluation parameters using the plurality of evaluation models; and
a process of automatically classifying at least one usage of the reusable battery based on the evaluation results, wherein the SOB information includes information on correlation between the SOC and the SOB according to a change in the SOC of the reusable battery, and wherein the evaluation parameter includes information on:
- SOC boundary values corresponding to boundary between a plurality of levels set for a SOB value of the reusable battery;
- correlation between the SOB and a rate of discharge (ROD) according to a change in the ROD of the reusable battery; and
- an upper limit of tolerant output for each operating time of the reusable battery.

6. The apparatus of claim 5, wherein the processor is further configured to perform a process of automatically outputting the evaluation results comprising a plurality of fields, the plurality of fields include a field for an evaluation grade of the reusable battery when applied to a corresponding usage, a field for a state of charge (SOC) range capable of operating the reusable battery in the corresponding usage, and a field for a tolerant output current of the reusable battery in the corresponding usage.

7. A method for an evaluation of a reusable battery with an aid of a digital computer, the method comprising:
- providing the computer with a data base including state of health (SOH) information, state of balance (SOB) information, and state of power (SOP) information of the reusable battery;
- extracting, by the computer, evaluation parameters from the SOH information, the SOB information, and the SOP information;
- inputting, by the computer, the evaluation parameters into each of a plurality of evaluation models that differently set a weight for each of the evaluation parameters according to usages of the reusable battery; and
- calculating, by the computer, evaluation results corresponding to the usages of the reusable battery from the evaluation parameters using the plurality of evaluation models;
- automatically classifying at least one usage of the reusable battery based on the evaluation results; and
- automatically outputting, by the computer, the evaluation results comprising a plurality of fields, the plurality of fields include a field for an evaluation grade of the reusable battery when applied to a corresponding usage, a field for a state of charge (SOC) range capable of operating the reusable battery in the corresponding usage, and a field for a tolerant output current of the reusable battery in the corresponding usage, wherein the SOB information includes information on correlation between the SOC and the SOB according to a change in the SOC of the reusable battery, and wherein the evaluation parameter includes information on:
- SOC boundary values corresponding to boundary between a plurality of levels set for a SOB value of the reusable battery;
- correlation between the SOB and a rate of discharge (ROD) according to a change in the ROD of the reusable battery; and
- an upper limit of tolerant output for each operating time of the reusable battery.

* * * * *